United States Patent
Chen et al.

(10) Patent No.: US 11,594,413 B2
(45) Date of Patent: Feb. 28, 2023

(54) SEMICONDUCTOR STRUCTURE HAVING SETS OF III-V COMPOUND LAYERS AND METHOD OF FORMING

(71) Applicant: TAIWAN SEMICONDUCTOR MANUFACTURING COMPANY, LTD., Hsinchu (TW)

(72) Inventors: Chi-Ming Chen, Zhubei (TW); Po-Chun Liu, Hsinchu (TW); Chung-Yi Yu, Hsinchu (TW); Chia-Shiung Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 65 days.

(21) Appl. No.: 17/039,324

(22) Filed: Sep. 30, 2020

(65) Prior Publication Data

US 2021/0028016 A1    Jan. 28, 2021

Related U.S. Application Data

(60) Continuation of application No. 17/011,418, filed on Sep. 3, 2020, now Pat. No. 11,417,520, which is a
(Continued)

(51) Int. Cl.
| | | |
|---|---|---|
| H01L 31/062 | (2012.01) | |
| H01L 21/02 | (2006.01) | |
| H01L 29/778 | (2006.01) | |
| H01L 29/66 | (2006.01) | |
| H01L 29/15 | (2006.01) | |

(Continued)

(52) U.S. Cl.
CPC .... *H01L 21/02507* (2013.01); *H01L 21/0251* (2013.01); *H01L 21/0254* (2013.01); *H01L 21/02458* (2013.01); *H01L 21/02505* (2013.01); *H01L 29/157* (2013.01); *H01L 29/2003* (2013.01); *H01L 29/205* (2013.01); *H01L 29/66462* (2013.01); *H01L 29/66522* (2013.01);
(Continued)

(58) Field of Classification Search
CPC ......... H01L 21/02458; H01L 21/02505; H01L 21/0251; H01L 21/0254; H01L 29/2003; H01L 29/66462; H01L 29/66522; H01L 29/778; H01L 29/7787; H01L 29/157; H01L 29/205; H01L 21/02507
USPC .................................. 438/172; 257/192, 194
See application file for complete search history.

(56) References Cited

U.S. PATENT DOCUMENTS

| | | | |
|---|---|---|---|
| 7,745,850 B2 * | 6/2010 | Otsuka | ................ H01L 29/7787 |
| | | | 257/190 |
| 7,851,284 B2 | 12/2010 | Zhang | |

(Continued)

FOREIGN PATENT DOCUMENTS

JP         2012234893        * 11/2012

*Primary Examiner* — Tan N Tran
(74) *Attorney, Agent, or Firm* — Hauptman Ham, LLP

(57) ABSTRACT

A semiconductor structure includes a substrate. The semiconductor structure further includes a buffer layer over the substrate, wherein the buffer layer comprises a plurality of III-V layers, and a dopant type of each III-V layer of the plurality of III-V layers is opposite to a dopant of adjacent
(Continued)

III-V layers of the plurality of III-V layers. The semiconductor structure further includes an active layer over the buffer layer. The semiconductor structure further includes a dielectric layer over the active layer.

20 Claims, 5 Drawing Sheets

Related U.S. Application Data continuation of application No. 16/126,906, filed on Sep. 10, 2018, now Pat. No. 10,804,101, which is a continuation of application No. 15/586,346, filed on May 4, 2017, now Pat. No. 10,074,537, which is a division of application No. 14/824,131, filed on Aug. 12, 2015, now Pat. No. 9,660,063, which is a continuation of application No. 13/743,045, filed on Jan. 16, 2013, now Pat. No. 9,142,407.

(51) Int. Cl.
    *H01L 29/20*     (2006.01)
    *H01L 29/205*     (2006.01)

(52) U.S. Cl.
    CPC ........ *H01L 29/778* (2013.01); *H01L 29/7787* (2013.01)

(56) References Cited

U.S. PATENT DOCUMENTS

| | | |
|---|---|---|
| 8,410,525 B2 | 4/2013 | Sato |
| 8,436,398 B2 | 5/2013 | Lidow |
| 8,513,703 B2 | 8/2013 | Bahl |
| 8,853,666 B2 | 10/2014 | Inoue |
| 9,142,407 B2 | 9/2015 | Chen |
| 9,660,063 B2 | 5/2017 | Chen et al. |
| 2004/0195562 A1 | 10/2004 | Munns |
| 2005/0263791 A1 | 12/2005 | Yanagihara et al. |
| 2006/0261356 A1 | 11/2006 | Iwakami et al. |
| 2010/0117118 A1 | 5/2010 | Dabiran |
| 2012/0049243 A1* | 3/2012 | Wu ................ H01L 29/42316 257/E29.246 |
| 2012/0153351 A1* | 6/2012 | Chandolu ............. H01L 29/205 257/192 |
| 2012/0326160 A1 | 12/2012 | Yanagihara et al. |
| 2013/0161634 A1 | 6/2013 | Disney |
| 2013/0200495 A1* | 8/2013 | Keller ............... H01L 21/02458 257/E29.089 |

\* cited by examiner

SEMICONDUCTOR STRUCTURE HAVING SETS OF III-V COMPOUND LAYERS AND METHOD OF FORMING

PRIORITY CLAIM

The present application is a continuation of U.S. application Ser. No. 17/011,418, filed Sep. 3, 2020, which is a continuation of U.S. application Ser. No. 16/126,906, filed Sep. 10, 2018, which is a continuation of U.S. application Ser. No. 15/586,346, filed May 4, 2017, which is divisional of U.S. application Ser. No. 14/824,131, filed Aug. 12, 2015, now U.S. Pat. No. 9,660,063, issued May 23, 2017, which is a continuation of U.S. application Ser. No. 13/743,045, filed Jan. 16, 2013, now U.S. Pat. No. 9,142,407, issued Sep. 22, 2015, which are incorporated herein by reference in their entireties.

BACKGROUND

In many semiconductor integrated circuits, Group III-Group V compounds (in the periodic table of elements), or III-V compounds, are used to form various electrical devices, such as high power field-effect transistors, high frequency transistors, high electron mobility transistors (HEMTs), or metal-insulator-semiconductor field-effect transistors (MISFETs). One example of III-V compounds used in semiconductor integrated circuits is gallium nitride (GaN). In many applications, the electrical devices are formed on a buffer layer, which is intended to be an undoped III-V compound layer. However, because of the presence of oxygen, silicon, and/or other impurity elements in the processing chamber for forming the buffer layer, the buffer layer usually becomes an unintentionally doped III-V compound layer having N-type doping. Thus, compared with the undoped version, the unintentionally doped buffer layer potentially provides a relatively low resistance path for leakage currents.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1A:
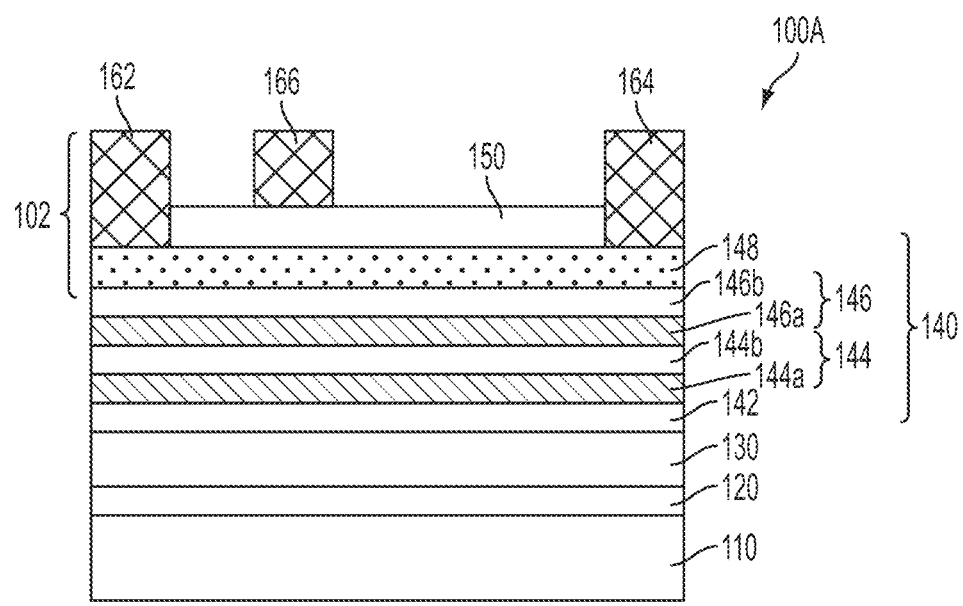
FIG. 1A is a cross-sectional view of a semiconductor structure including a high electron mobility transistor (HEMT) in accordance with some embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a cross-sectional view of a semiconductor structure 100A including an HEMT 102 in accordance with some embodiments. The semiconductor structure 100A includes a substrate 110. In some embodiments, the substrate 110 includes a silicon carbide (SiC) substrate, sapphire substrate, or a silicon substrate. The semiconductor structure 100A further includes a nucleation layer 120 over the substrate, a transition layer 130 over the nucleation layer, a buffer layer 140 over the transition layer, an active layer 150 over the buffer layer, a source electrode 162 and a drain electrode 164 over the buffer layer, and a gate electrode over the active layer. The buffer layer 140 includes III-V compound layers 142, 144a, 144b, 146a, 146b, and 148 stacked one over another. III-V compound layers 144a and 144b are collectively referred to as a set of III-V compound layers 144, and III-V compound layers 146a and 146b are collectively referred to as another set of III-V compound layers 146.

Nucleation layer 120 has a lattice structure and thermal expansion coefficient (TEC) suitable for bridging the lattice mismatch and TEC mismatch between the substrate 110 and the buffer layer 140. In some embodiments, nucleation layer 120 has aluminum nitride (AlN). In some embodiments, nucleation layer 120 has a thickness ranging from 150 to 300 nanometers (nm). Transition layer 130 further facilitates gradual changes of lattice structures and TECs between the nucleation layer 120 and the buffer layer 140. In some embodiments, when the III-V compound layers 142, 144a, 144b, 146a, 146b, and 148 include gallium nitride (GaN), the transition layer 130 is a graded aluminum-gallium nitride ($Al_xGa_{(1-x)}N$, x is the aluminum content ratio in the aluminum-gallium constituent) layer. In some embodiments, the graded aluminum gallium nitride layer includes multiple layers each having a decreased ratio x (from a layer adjoining the nucleation layer 120 to that adjoin the buffer layer 140, or from the bottom to the top portions of the graded aluminum gallium nitride layer). In at least one embodiment, the graded aluminum gallium nitride layer has four layers whose ratios x are 0.75, 0.5, 0.25, and 0.1, from the bottom to the top. In some embodiments, instead of having multiple layers, the graded aluminum gallium nitride layer has a continuous gradient of the ratio x. In some embodiments, transition layer 130 has a thickness ranging from 500 to 1000 nm.

In some embodiments, nucleation layer 120 and/or transition layer 130 are omitted, and thus the III-V compound layer 142 is directly on the substrate 110.

In the embodiment depicted in FIG. 1A, III-V compound layers 142, 144b, and 146b have P-type doping, and III-V compound layers 144a and 146a have N-type doping. Moreover, buffer layer 140 provides an undoped or unintentionally doped III-V compound layer (e.g., the second III-V layer 148) on which the HEMT 102 is formed. Because, in some application, the second III-V layer 148 is unintentionally doped and has N-type doping, the buffer layer 140 includes three P-N junctions between layers 142 and 144a, 144b and 146a, and 146b and 148. When the substrate 110 is biased to a supply voltage lower than the voltages at the electrodes 162, 164, and 166 of the HEMT 102, the P-N junctions 142/144a, 144b/146a, and 146b/148 are reversed-biased. Therefore, compared with the a configuration where a buffer layer includes only a single undoped or unintentionally doped III-V compound layer, buffer layer 140 provides a relatively high resistance path for leakage currents by having reversed-biased PN junctions.

In some embodiments, the III-V compound layer 144a is at least one of undoped, unintentionally doped having N-type doping, or doped having the N-type doping. In some embodiments, the III-V compound layer 146a is at least one of undoped, unintentionally doped having N-type doping, or doped having the N-type doping. In some embodiments, the second III-V compound layer 148 is either undoped or unintentionally doped having the N-type doping.

In some embodiments, layer 144a (N-type doping) is configured to cause a depletion region formed within layer 142 (P-type doping), and a thickness of layer 142 is set to be sufficient to prevent the depletion region from extending through the entire thickness of the layer 142. In some embodiments, III-V compound layer 142 comprises GaN and has a thickness greater than 0.15 micrometers (μm). In some embodiments, III-V compound layer 142 comprises GaN and has a doping concentration greater than $1.0 \times 10^{19}$ atoms/cm$^3$.

In the embodiment depicted in FIG. 1A, two sets (144 and 146) of III-V compound layers are depicted. Each of the two sets of layers includes a lower layer 144a or 146a having N-type doping and an upper layer 144b and 146b having P-type doping. In some embodiments, there are more or less than two sets of III-V compound layers. In some embodiments, the number of sets of III-V compound layers ranges from 1 to 200.

In some embodiments, III-V compound layer 146a is configured to cause a depletion region formed within III-V compound layer 144b, and a thickness of layer 144b is set to be sufficient to prevent the depletion region from extending through the entire thickness of layer 144b. In some embodiments, III-V compound layer 148 is configured to cause a depletion region formed within III-V compound layer 146b, and a thickness of layer 146b is set to be sufficient to prevent the depletion region from extending through the entire thickness of layer 146b. In some embodiments, in one of the one or more sets of III-V compound layers, the upper III-V compound layer 144b or 146b has a thickness no less than that of the corresponding layer 146a or 148 immediately thereon. In some embodiments, each of the layers 144a, 144b, 146a, or 146b has a thickness ranging from 0.05 μm to 0.1 μm.

In some embodiments, III-V compound layers 144a and 146a comprise GaN and have a doping concentration no greater than $1.0 \times 10^{17}$ atoms/cm$^3$. In some embodiments, III-V compound layers 144b and 146b comprise GaN and have a doping concentration ranging from $1.0 \times 10^{15}$ to $1.0 \times 10^{19}$ atoms/cm$^3$. In some embodiments, all sets of III-V compound layers 144 and 146 have a same configuration. In some embodiments, not all sets of III-V compound layers 144 and 146 have the same configuration.

According to one or more embodiments of this disclosure, the HEMT 102 includes the heterojunction formed between two different semiconductor material layers, such as the active layer 150 and III-V layer 148. The band gap discontinuity exists between the active layer 150 and the III-V compound layer 148. The electrons from a piezoelectric effect in the active layer 150 drop into the III-V compound layer 148, and thus create a thin layer of highly mobile conducting electrons in the III-V compound layer 148. This thin layer is also referred to as a two-dimensional electron gas (2-DEG) layer. The 2-DEG layer is formed within the III-V compound layer 148 near an interface of the active layer 150 and the III-V compound layer 148, and between the electrodes 162 and 164. The 2-DEG layer is used as a channel of the HEMT 102. In some embodiments, the channel has high electron mobility because the III-V compound layer 148 is undoped or unintentionally doped, and the electrons can move freely without collision or with substantially reduced collisions with impurities. The active layer 150 is also known as a donor-supply layer, and the III-V layer 148 is also known as a channel layer.

In some embodiments, the channel layer and the donor-supply layer are compounds made from the III-V groups in the periodic table of elements. In some embodiments, the channel layer and the donor-supply layer are different from each other in composition. In some embodiments, the III-V compound layer 148 is undoped or unintentionally doped. In some embodiments, the active layer 150 is intentionally doped. In some embodiments when III-V layer 148 comprises GaN, active layer 150 comprises AlN, AlGaN, or a combination thereof.

Electrode 162 and electrode 164 are disposed on the III-V compound layer 148, and electrode 166 is disposed on the active layer 150. Electrode 162 is used as a source electrode, the electrode 164 is used as a drain electrode, and the electrode 166 is used as a gate electrode of the HEMT 102. When a voltage is applied to the gate electrode 166, a device current of the HEMT 102 could be modulated.

Figure 1B:
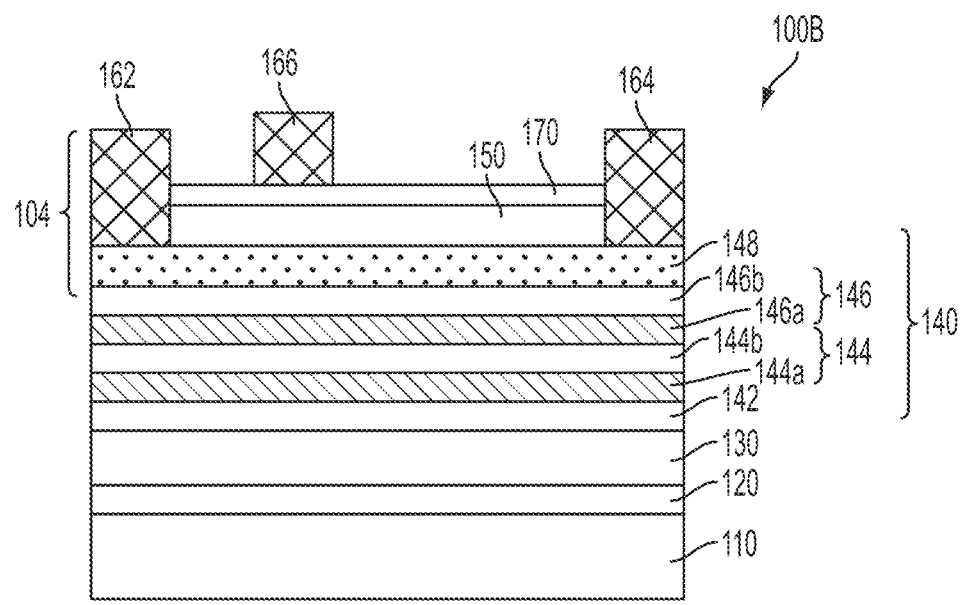
FIG. 1B is a cross-sectional view of a semiconductor structure including a metal-insulator-semiconductor field-effect transistor (MISFET) in accordance with some embodiments.

FIG. 1B is a cross-sectional view of a semiconductor structure 100B including an MISFET 104 in accordance with some embodiments. Compared with the semiconductor structure 100B, a dielectric layer 170 is disposed over the active layer 150 and below the gate electrode 166. In some embodiments, the dielectric layer 170 comprises silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$), or a combination thereof.

Figure 2:
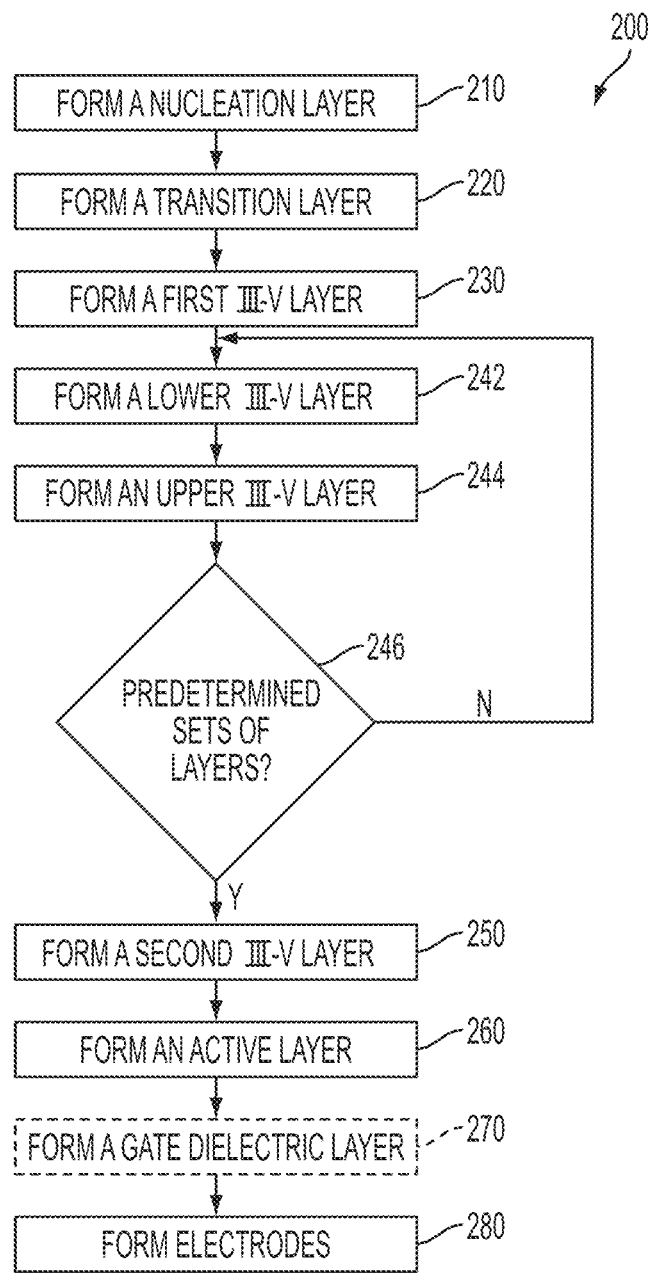
FIG. 2 is a flow chart of a method of forming a HEMT or a MISFET in accordance with one or more embodiments.

FIG. 2 is a flow chart of a method 200 of forming a semiconductor structure 100A including a HEMT 102 or a semiconductor structure 100B including a MISFET 104 in accordance with one or more embodiments. FIGS. 3A-3F are cross-sectional views of a semiconductor structure 100A including HEMT 102 in various manufacturing stages in accordance with one or more embodiments. It is understood that additional operations may be performed before, during, and/or after the method 200 depicted in FIG. 2, and that some other processes may only be briefly described herein.

Figure 3A:
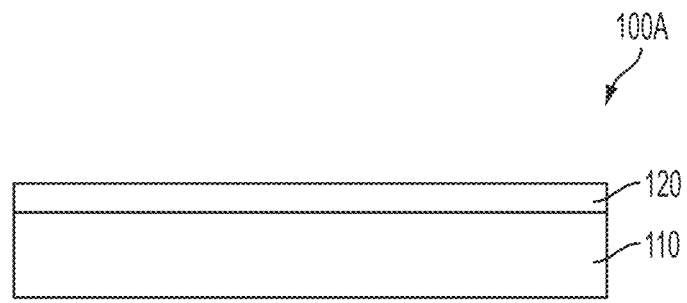
FIGS. 3A-3F are cross-sectional views of a semiconductor structure including a HEMT in various manufacturing stages in accordance with one or more embodiments.

As depicted in FIG. 2 and FIG. 3A, the semiconductor structure 100A includes a substrate 110. In some embodiments, substrate 110 is a (111) silicon substrate.

In operation 210, a nucleation layer 120 is formed over substrate 110. In some embodiments, nucleation layer 120 comprises AlN. In some embodiments, the formation of nucleation layer 120 is performed by a metal-organic chemical vapor deposition (MOCVD) process, using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the nucleation layer 120 comprises a material other than AlN. In some embodiments, nucleation layer 120 has a thickness ranging from 150 to 300 nm.

In some embodiments, nucleation layer 120 is omitted, and thus operation 210 is omitted.

Figure 3B:
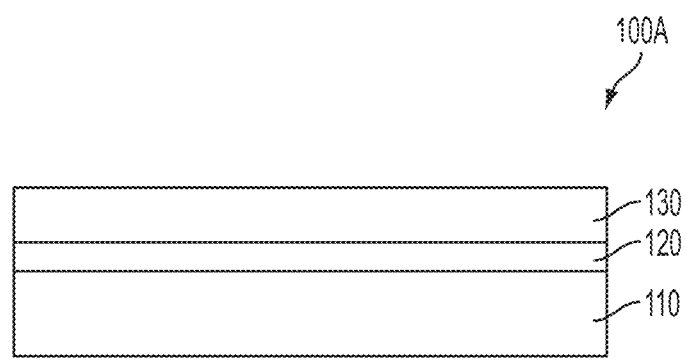

The process proceeds to operation 220. As depicted in FIG. 2 and FIG. 3B, in operation 220, a transition layer 130 is formed over nucleation layer 120. In some embodiments, transition layer 130 is a graded aluminum-gallium nitride ($Al_xGa_{(1-x)}N$) layer. In some embodiments, the graded aluminum gallium nitride layer has two or more of aluminum-gallium nitride layers each having a different ratio x decreased from the bottom to the top. In some embodiments, each of the two or more of aluminum-gallium nitride layers is formed by performing a MOCVD process, using aluminum-containing precursor, gallium-containing precursor, and nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, the graded aluminum-gallium nitride layer is formed by performing a MOCVD process. In some embodiments, the transition layer 130 has a thickness ranging from 500 to 1000 nm.

In some embodiments, transition layer 130 is omitted, and thus operation 220 is omitted.

Figure 3C:
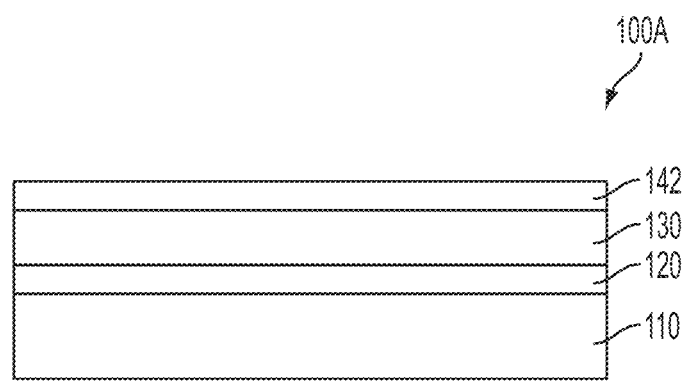

The process proceeds to operation 230. As depicted in FIG. 2 and FIG. 3C, in operation 230, a first III-V compound layer 142 having a first-type doping is formed over substrate 110, nucleation layer 120, and/or transition layer 130. In some embodiments, the first type doping is P-type doping. In some embodiments, first III-V compound layer 142 comprises GaN, and the P-type doping is implemented by using dopants including carbon, iron, magnesium, or zinc. In at least one embodiment, when the manufacture of HEMT 102 is completed, a layer (such as layer 142a) over first III-V compound layer 142 is configured to cause a depletion region formed within the first III-V compound layer 142. As such, a thickness of first III-V compound layer 142 is set to be sufficient to prevent the depletion region from extending through the entire thickness of the first III-V compound layer 142.

In some embodiments, first III-V compound layer 142 has a thickness greater than 0.15 μm. In some embodiments, the first III-V compound layer has a doping concentration greater than $1.0\times10^{19}$ atoms/cm$^3$. In some embodiments, first III-V compound layer 142 is formed by performing a MOCVD process, using gallium-containing precursor and nitrogen-containing precursor.

Figure 3D:
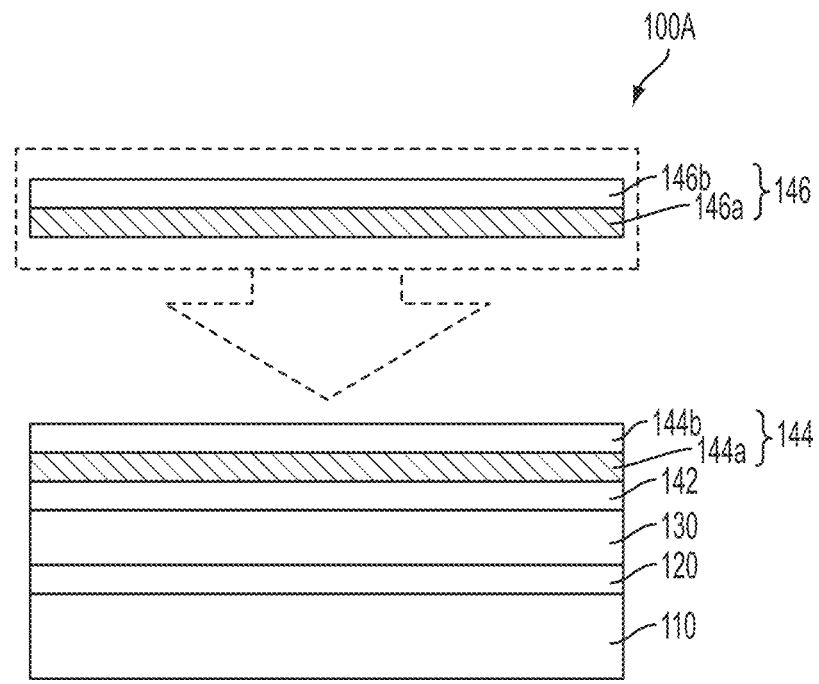

The process proceeds to operation 242. As depicted in FIG. 2 and FIG. 3D, in operation 242, a lower III-V layer 144a corresponding to the III-V compound layer 142 in FIG. 1A is formed over the first III-V compound layer 142. In some embodiments, the lower III-V layer 144a is undoped, unintentionally doped having a second type doping, or doped having the second type doping. In some embodiments, the second type doping is N-type doping. In some embodiments, lower III-V compound layer 144a comprises GaN, and the N-type doping is implemented by using dopants including silicon or oxygen. In some embodiments, lower III-V compound layer 144a has a doping concentration no greater than $1.0\times10^{17}$ atoms/cm$^3$. In some embodiments, lower III-V compound layer 144a has a thickness ranging from 0.05 μm to 0.1 μm. In some embodiments, lower III-V compound layer 144a is formed by performing a MOCVD process, using gallium-containing precursor and nitrogen-containing precursor.

The process proceeds to operation 244, where an upper III-V compound layer 144b is formed over the lower III-V compound layer 144a. The lower III-V compound layer 144a and the upper III-V compound layer 144b are collectively referred to as a first set of III-V compound layers 144. In some embodiments, the upper III-V layer 144b has the first type doping (e.g., the P-type doping). In some embodiments, upper III-V compound layer 144b comprises GaN. In at least one embodiment, when the manufacture of HEMT 102 is completed, a layer (such as layer 146a or layer 148 if layers 146a and 146b are omitted) over upper III-V compound layer 144b is configured to cause a depletion region formed within the upper III-V compound layer 144b. As such, a thickness of upper III-V compound layer 144b is set to be sufficient to prevent the depletion region from extending through the entire thickness of the upper III-V compound layer 144b. In some embodiments, thickness of upper III-V compound layer 144b is set to be greater than a thickness of a layer immediately on the upper III-V compound layer 144b.

In some embodiments, upper III-V compound layer 144b has a doping concentration $1.0\times10^{15}$ to $1.0\times10^{19}$ atoms/cm$^3$. In some embodiments, upper III-V compound layer 144b has a thickness ranging from 0.05 μm to 0.1 μm. In some embodiments, upper III-V compound layer 144b is formed by performing a MOCVD process, using gallium-containing precursor and nitrogen-containing precursor.

The process proceeds to operation 246, where whether a predetermined number of sets of III-V compound layers similar to the set of III-V compound layers 144 has been formed in the semiconductor structure 100A. In some embodiments, the predetermined number is set to be a number ranging from 1 to 200. If it is determined that at least another set of III-V compound layers, such as the set of III-V compound layers 146, needs to be further formed, the process proceeds to operation 242 to form lower III-V compound layer 146a and operation 244 to form upper compound 146b for the set of III-V compound layers 146. In some embodiments, the set of III-V compound layers 144 and the set of III-V compound layers 146 have a similar configuration and are fabricated by a similar process. In some embodiments, not all the predetermined sets of III-V compound layers have the same thickness and/or doping concentration. In at least one embodiments, all the predetermined sets of III-V compound layers have undoped or N-type lower III-V layers and P-type upper III-V Layers.

In operation 246, if no further set of III-V compound layers is needed, the process proceeds to operation 250.

Figure 3E:
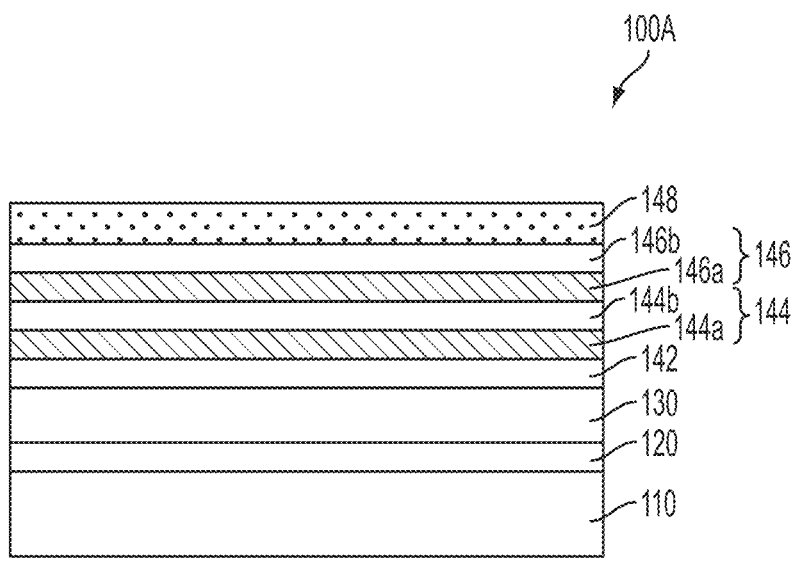

As depicted in FIG. 2 and FIG. 3E, in operation 250, a second III-V compound layer 148 is formed over the one or more sets of III-V compound layers 144 and 146. Second III-V compound layer 148 is undoped, or unintentionally doped having the second type doping (e.g. N-type doping). In some embodiments, Second III-V compound layer 148 comprises GaN. In some embodiments, second III-V compound layer 148 has a thickness ranging from 0.25 to 0.5 μm. In some embodiments, the first III-V compound layer has a doping concentration no greater than $1.0\times10^{16}$ atoms/cm$^3$. In some embodiments, second III-V compound layer 148 is formed by performing a MOCVD process, using gallium-containing precursor and nitrogen-containing precursor.

Figure 3F:
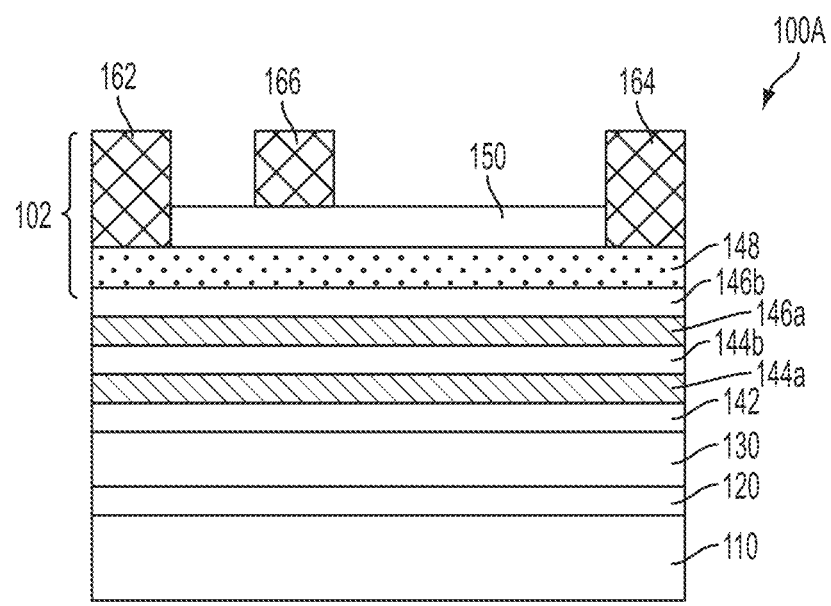

The process proceeds to operation 260. As depicted in FIG. 2 and FIG. 3F, in operation 260, an active layer 150 corresponding to the active layer 150 in FIG. 1 is formed over the second III-V compound layer 148. In some embodiments, active layer 150 includes AlGaN, aluminum-gallium Arsenide (AlGaAs), aluminum-Indium phosphide (AlInP), or a combination thereof. In some embodiments, active layer 150 includes AlGaN, where an aluminum content ratio in the aluminum-gallium constituent ranges from 0.1 to 0.25. In some embodiments, active layer 150 has a thickness ranging from 15 to 30 nm. In some embodiments, active layer 150 is formed by performing a MOCVD process, using aluminum-containing precursor, gallium-containing precursor, and nitrogen-containing precursor.

For forming HEMT 102, operation 270 is omitted and the process proceeds to operation 280. As depicted in FIG. 2 and FIG. 3F, in operation 280, electrodes 162 and 164 are formed over second III-V compound layer 148, and electrode 166 is formed over active layer 150. In some embodiments, a patterned mask layer (i.e., a photoresistive layer) is formed on the upper surface of active layer 150, and an etching process is performed to remove a portion of the active layer 150 to form openings partially exposing an upper surface of second III-V compound layer 148. A metal layer is then deposited over patterned active layer 150 and fills the openings and contacts the second III-V compound layer 148. Another patterned photoresist layer is formed over the metal layer, and the metal layer is etched to form electrodes 162 and 164 over the openings and electrode 166 over the upper surface of active layer 150. In some embodiments, the metal layer for forming electrodes 162, 164, and 166 includes one or more conductive materials. In some embodiments, electrodes 162, 164, and 166 include one or more layers of conductive materials. In at least one embodiment, electrodes 162, 164, and 166 include at least one barrier layer contacting the second III-V compound layer 148 and/or the active layer 150.

Figure 3G:
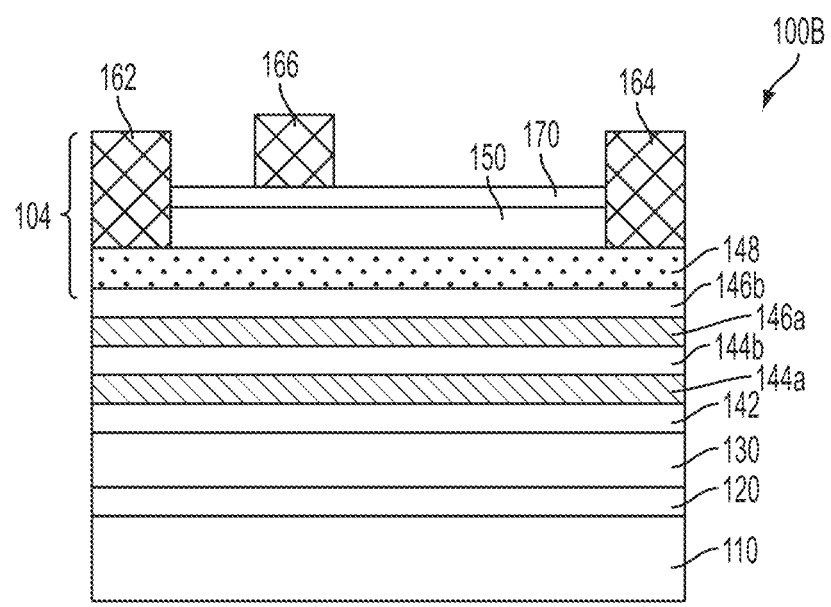
FIG. 3G, in conjunction with FIGS. 3A-3E, is a cross-sectional view of a semiconductor structure including a HEMT in accordance with one or more embodiments.

FIG. 3G is a cross-sectional view of a semiconductor structure 100B including a MISFET 104 in accordance with some embodiments. FIG. 3G, in conjunction with FIGS. 3A-3E are cross-sectional views of the semiconductor structure 100B in various manufacturing stages in accordance with one or more embodiments.

In a process for forming the semiconductor structure 100B, after performing the operations similar to operations 210 to 260, the process proceeds to operation 260. As depicted in FIGS. 2 and 3G, in operation 260, a dielectric layer 170 is formed over the active layer 150. In some embodiments, dielectric layer 170 includes silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$), or a combination thereof. In at least one embodiment, dielectric layer 170 has a thickness ranging from 3 nm to 100 nm. In some embodiments, dielectric layer 170 is formed by any proper fabrication technique, such as MOCVD, chemical vapor deposition (CVD), physical vapor deposition (PVD), atomic layer deposition (ALD), or thermal oxidation. In some embodiments, the dielectric layer 170 provides further isolation to prevent gate leakage.

The process then proceeds to operation 280, where openings through the active layer 150 and the dielectric layer 170 are formed, electrodes 162 and 164 are formed on the second III-V compound layer 148, and electrode 166 is formed on the dielectric layer 170. The operation 280 for forming the semiconductor structure 100B is similar to operation 280 for forming the semiconductor structure 100A, and thus description thereof is omitted.

An aspect of this description relates to a semiconductor structure. The semiconductor structure includes a substrate. The semiconductor structure further includes a buffer layer over the substrate, wherein the buffer layer comprises a plurality of III-V layers, and a dopant type of each III-V layer of the plurality of III-V layers is opposite to a dopant of adjacent III-V layers of the plurality of III-V layers. The semiconductor structure further includes an active layer over the buffer layer. The semiconductor structure further includes a dielectric layer over the active layer. In some embodiments, the semiconductor structure further includes a channel layer between the buffer layer and the active layer. In some embodiments, the semiconductor structure further includes a source electrode directly contacting the channel layer. In some embodiments, at least one of plurality of III-V layers includes GaN. In some embodiments, the semiconductor structure further includes a nucleation layer between the substrate and the buffer layer. In some embodiments, the nucleation layer includes AlN. In some embodiments, the nucleation layer is configured to reduce lattice mismatch between the substrate and the buffer layer. In some embodiments, the buffer layer direct contacts the substrate.

An aspect of this description relates to a method of forming a semiconductor structure. The method includes forming a nucleation layer over a substrate. The method further includes growing a buffer layer over the nucleation layer, wherein growing the buffer layer includes growing a plurality of pairs of layers, each pair of layers of the plurality of pairs of layers includes a lower III-V compound layer and an upper III-V compound layer, the lower III-V compound layer is undoped or has a first doping type, and the upper III-V compound layer has a second doping type opposite the first doping type. The method further includes growing a channel layer over the buffer layer. The method further includes forming an active layer over the channel layer. The method further includes depositing a dielectric layer over the active layer. In some embodiments, the method further includes growing a transition layer over the nucleation layer, wherein the transition layer is between the nucleation layer and the buffer layer. In some embodiments, growing the transition layer includes growing a graded AlGaN layer. In some embodiments, forming the nucleation layer includes depositing AlN. In some embodiments, the method further includes forming a gate structure, wherein the gate structure includes a plurality of source/drain (S/D) electrodes and a gate electrode. In some embodiments, forming the gate structure includes forming each of the S/D electrodes in direct contact with the channel layer. In some embodiments, forming the gate structure includes forming the gate electrode closer to a first S/D electrode of the plurality of S/D electrodes than to a second S/D electrode of the plurality of S/D electrodes.

An aspect of this description relates to a semiconductor structure. The semiconductor structure includes a substrate. The semiconductor structure further includes a first GaN layer over the substrate, the first GaN layer having P-type doping. The semiconductor structure further includes a second GaN layer over the first GaN layer, wherein the second GaN layer is undoped. The semiconductor structure further includes a third GaN layer over the second GaN layer, wherein the third GaN layer is P-type doped. The semiconductor structure further includes a fourth GaN layer over the third GaN layer, the fourth GaN layer being undoped. The semiconductor structure further includes a channel layer over the fourth GaN layer. The semiconductor structure further includes an active layer over the channel layer, wherein the channel layer extends beyond the active layer in a direction parallel to a top surface of the substrate. In some embodiments, the semiconductor structure further includes a dielectric layer directly contacting the active layer. In some embodiments, the semiconductor structure further includes a nucleation layer between the first III-V layer and the substrate. In some embodiments, the semiconductor structure further includes a two-dimensional electron gas (2-DEG) in the channel layer. In some embodiments, the first GaN layer directly contacts the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a substrate;
    a buffer layer over the substrate, wherein the buffer layer comprises a plurality of III-V layers, and a dopant type of each III-V layer of the plurality of III-V layers is opposite to a dopant type of adjacent III-V layers of the plurality of III-V layers;
    an active layer over the buffer layer, wherein the active layer consists of a single layer; and
    a dielectric layer over the active layer, wherein the dielectric layer is continuous over an entirety of the active layer.

2. The semiconductor structure of claim 1, further comprising a channel layer between the buffer layer and the active layer.

3. The semiconductor structure of claim 2, further comprising a source electrode directly contacting the channel layer.

4. The semiconductor structure of claim 1, wherein at least one of the plurality of III-V layers comprises GaN.

5. The semiconductor structure of claim 1, further comprising a nucleation layer between the substrate and the buffer layer.

6. The semiconductor structure of claim 5, wherein the nucleation layer comprises AN.

7. The semiconductor structure of claim 5, wherein the nucleation layer is configured to reduce lattice mismatch between the substrate and the buffer layer.

8. The semiconductor structure of claim 1, wherein the buffer layer directly contacts the substrate.

9. A method of forming a semiconductor structure, the method comprising:
    forming a nucleation layer over a substrate;
    growing a buffer layer over the nucleation layer, wherein growing the buffer layer comprises growing a plurality of pairs of layers, each pair of layers of the plurality of pairs of layers includes a lower III-V compound layer and an upper III-V compound layer, the lower III-V compound layer is undoped or has a first doping type, and the upper III-V compound layer has a second doping type opposite the first doping type;
    growing a channel layer over the buffer layer;
    forming an active layer over the channel layer, wherein the channel layer extends beyond the active layer in a direction parallel to a top surface of the substrate; and
    depositing a dielectric layer over the active layer.

10. The method of claim 9, further comprising growing a transition layer over the nucleation layer, wherein the transition layer is between the nucleation layer and the buffer layer.

11. The method of claim 10, wherein the growing the transition layer comprises growing a graded AlGaN layer.

12. The method of claim 9, wherein forming the nucleation layer comprises depositing AN.

13. The method of claim 9, further comprising forming a plurality of electrodes, wherein the plurality of electrodes comprises a plurality of source/drain (S/D) electrodes and a gate electrode.

14. The method of claim 13, wherein the forming the plurality of electrodes comprises forming each of the S/D electrodes in direct contact with the channel layer.

15. The method of claim 13, wherein forming the gate structure comprises forming the gate electrode closer to a first S/D electrode of the plurality of S/D electrodes than to a second S/D electrode of the plurality of S/D electrodes.

16. A semiconductor structure, comprising:
    a substrate;
    a first GaN layer over the substrate, the first GaN layer having P-type doping;
    a second GaN layer over the first GaN layer, wherein the second GaN layer is undoped;
    a third GaN layer over the second GaN layer, wherein the third GaN layer is P-type doped;
    a fourth GaN layer over the third GaN layer, the fourth GaN layer being undoped;
    a channel layer over the fourth GaN layer; and
    an active layer over the channel layer, wherein the channel layer extends beyond the active layer in a direction parallel to a top surface of the substrate.

17. The semiconductor structure of claim 16, further comprising a dielectric layer directly contacting the active layer.

18. The semiconductor structure of claim 16, further comprising a nucleation layer between the first GaN layer and the substrate.

19. The semiconductor structure of claim 16, further comprising a two-dimensional electron gas (2-DEG) in the channel layer.

20. The semiconductor structure of claim 16, wherein the first GaN layer directly contacts the substrate.

* * * * *